(12) United States Patent
Riquelme et al.

(10) Patent No.: US 10,134,995 B2
(45) Date of Patent: Nov. 20, 2018

(54) WATER PROCESSABLE N-TYPE ORGANIC SEMICONDUCTOR

(71) Applicant: University of Kentucky Research Foundation, Lexington, KY (US)

(72) Inventors: Ruben S. Riquelme, Lexington, KY (US); Matthew C. Weisenberger, Lexington, KY (US); Camila F. Gomez, Lexington, KY (US)

(73) Assignee: UNIVERSITY OF KENTUCKY RESEARCH FOUNDATION, Lexington, KY (US)

( * ) Notice: Subject to any disclaimer, the term of this patent is extended or adjusted under 35 U.S.C. 154(b) by 121 days.

(21) Appl. No.: 15/417,729

(22) Filed: Jan. 27, 2017

(65) Prior Publication Data

US 2017/0222151 A1    Aug. 3, 2017

Related U.S. Application Data

(60) Provisional application No. 62/288,717, filed on Jan. 29, 2016.

(51) Int. Cl.

| H01L 29/08 | (2006.01) |
|---|---|
| H01L 21/00 | (2006.01) |
| H01L 51/00 | (2006.01) |
| H01L 51/05 | (2006.01) |
| H01L 35/24 | (2006.01) |
| H01L 35/22 | (2006.01) |

(Continued)

(52) U.S. Cl.
CPC .......... H01L 51/0048 (2013.01); H01L 35/22 (2013.01); H01L 35/24 (2013.01); H01L 35/28 (2013.01); H01L 35/34 (2013.01); H01L 51/0003 (2013.01); H01L 51/004 (2013.01); H01L 51/0005 (2013.01); H01L 51/0558 (2013.01)

(58) Field of Classification Search
CPC . H01L 51/0005; H01L 51/0048; H01L 35/22; H01L 35/24; H01L 35/28; H01L 35/34
See application file for complete search history.

(56) References Cited

U.S. PATENT DOCUMENTS

| 6,433,359 B1 | 8/2002 | Kelley et al. |
| 8,053,767 B2 | 11/2011 | Lee et al. |
| 8,124,443 B2 | 2/2012 | Marrocco et al. |

(Continued)

FOREIGN PATENT DOCUMENTS

| DE | 4221279 A1 | 1/1994 |
| KR | 2012076069 A | 7/2012 |

(Continued)

OTHER PUBLICATIONS

WO 2011071295—English machine translation.

(Continued)

*Primary Examiner* — Alonzo Chambliss
(74) *Attorney, Agent, or Firm* — King & Schickli, PLLC

(57) ABSTRACT

The present invention concerns a water-processable n-type semiconductor comprised of polyvinylpyrrolidone (PVP), carbon nanotubes (CNTs) and poly(ethyleneimine) (PEI). The semiconductors are prepared by providing PVP and CNTs in a hydrophilic slurry and dispersing therein small amounts of PEI.

19 Claims, 18 Drawing Sheets

(51) Int. Cl.
*H01L 35/34* (2006.01)
*H01L 35/28* (2006.01)

(56) References Cited

U.S. PATENT DOCUMENTS

| | | |
|---|---|---|
| 8,269,021 B2 | 9/2012 | Lee et al. |
| 8,349,219 B2 | 1/2013 | Hong et al. |
| 8,501,529 B2 | 8/2013 | Yoon et al. |
| 8,900,516 B2 | 12/2014 | Joseph et al. |
| 8,907,323 B2 | 12/2014 | Freedman |
| 9,133,130 B2 | 9/2015 | Wei et al. |
| 9,416,009 B2 | 8/2016 | Zhao et al. |
| 9,502,152 B2 * | 11/2016 | Park .................. B82Y 10/00 |
| 2004/0069454 A1 | 4/2004 | Bonsignore et al. |
| 2007/0114138 A1 | 5/2007 | Krasteva et al. |
| 2009/0133731 A1 | 5/2009 | Grebel et al. |
| 2010/0009165 A1 | 1/2010 | Patel et al. |
| 2011/0257033 A1 | 10/2011 | Strano et al. |
| 2013/0234128 A1 | 9/2013 | Aomori |
| 2014/0212656 A1 | 7/2014 | Rudhardt et al. |
| 2014/0230871 A1 | 8/2014 | Nishio et al. |
| 2014/0252342 A1 | 9/2014 | Ramadas et al. |
| 2015/0037517 A1 | 2/2015 | Buriak et al. |
| 2016/0099412 A1 * | 4/2016 | Li .................. H01L 51/0036 257/40 |
| 2016/0170303 A1 | 6/2016 | Kamochi et al. |
| 2017/0033292 A1 * | 2/2017 | Park .................. B82Y 10/00 |
| 2017/0092865 A1 * | 3/2017 | Yuning ............... H01L 51/0036 |

FOREIGN PATENT DOCUMENTS

| | | |
|---|---|---|
| KR | 2013029977 A | 3/2013 |
| WO | 2011071295 A1 | 6/2011 |
| WO | 2015084945 A1 | 6/2015 |

OTHER PUBLICATIONS

KR 2013029977 A—English machine translation.
KR 2012076069 A—English machine translation of Abstract only available.
DE4221279—English machine translation.

* cited by examiner

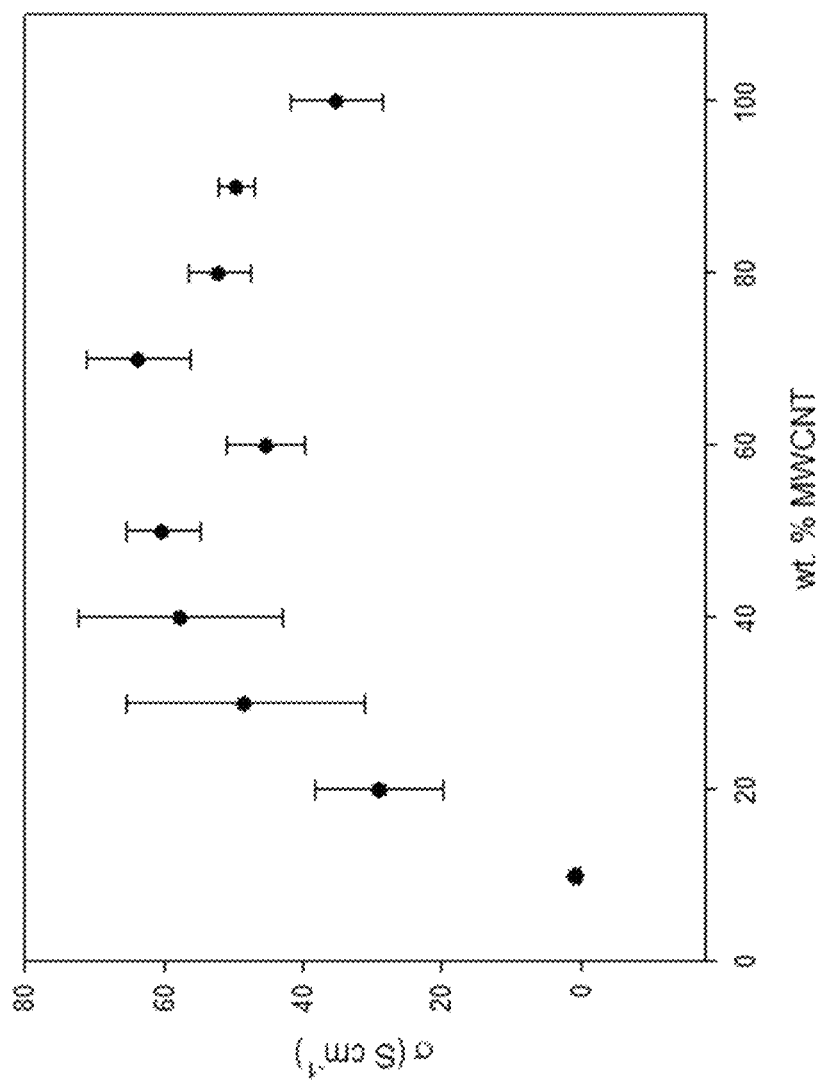

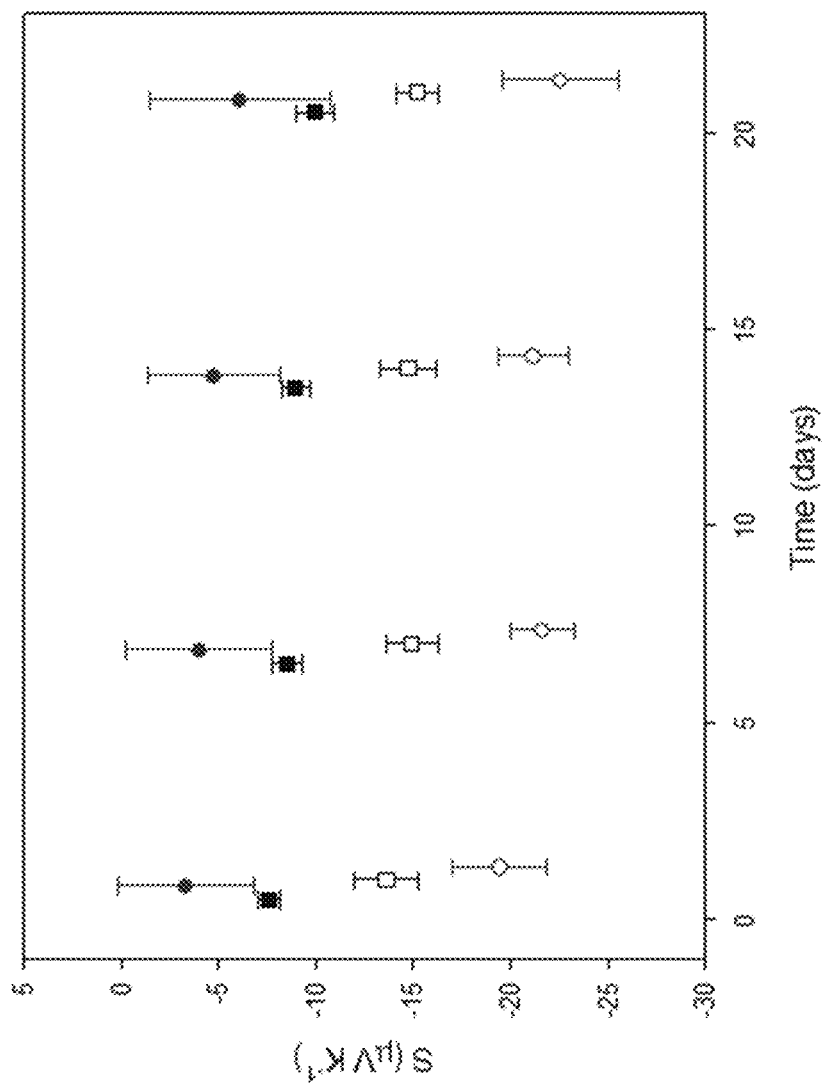

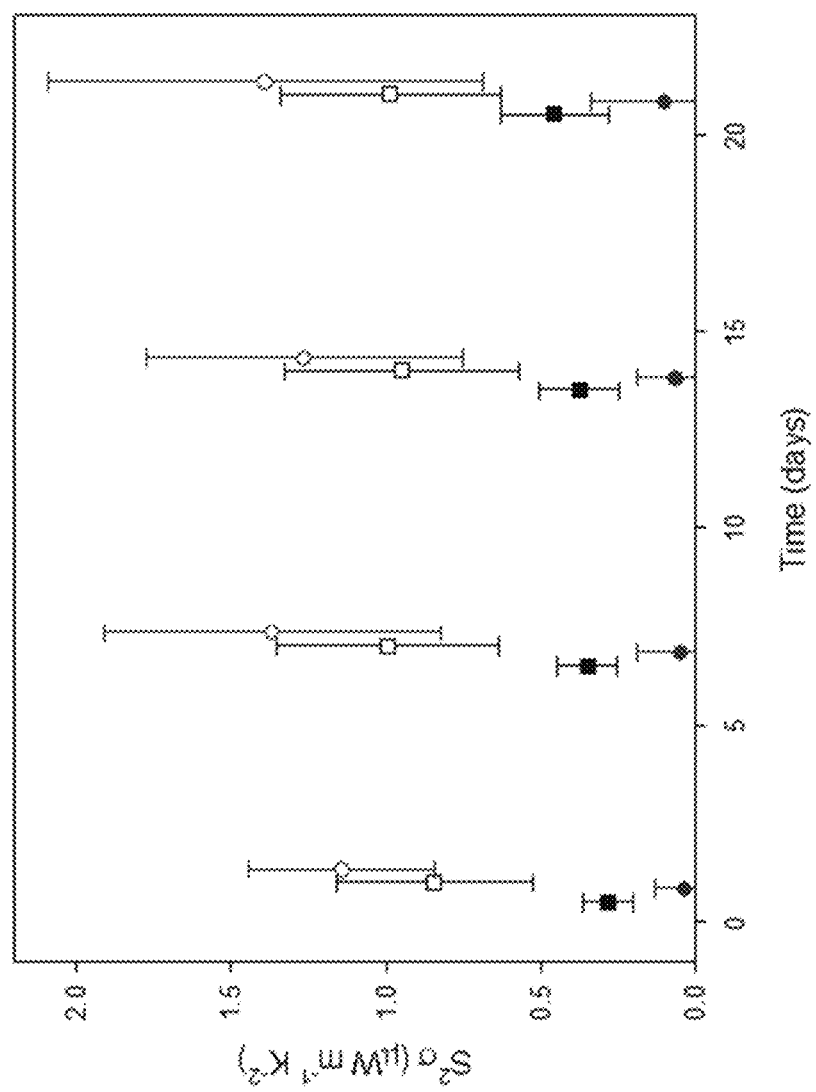

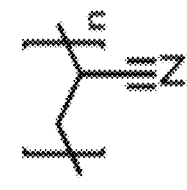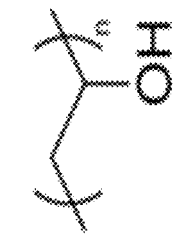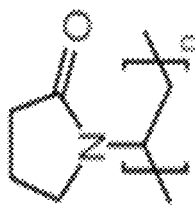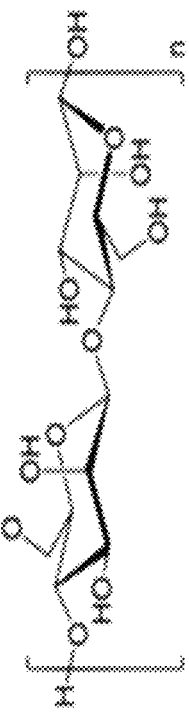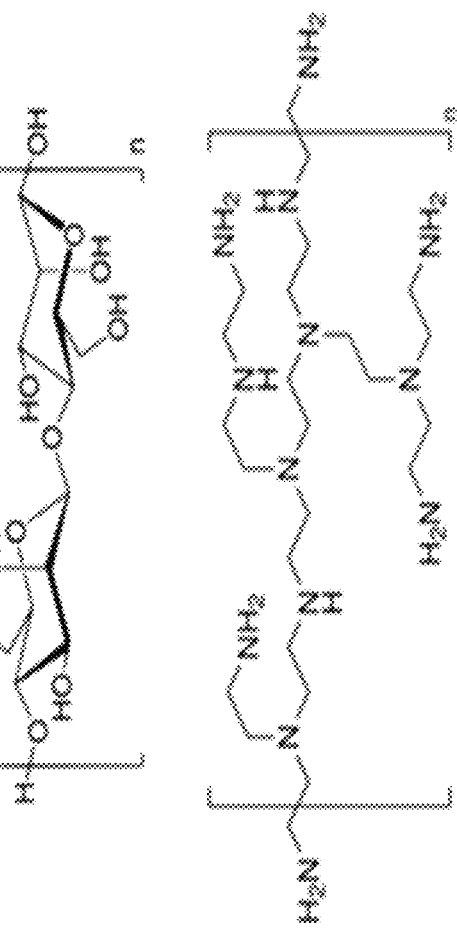
Figure 4a  Figure 4b  Figure 4c  Figure 4d  Figure 4e

WATER PROCESSABLE N-TYPE ORGANIC SEMICONDUCTOR

RELATED APPLICATIONS

This application claims priority to U.S. Provisional Patent Application 62/288,717, filed Jan. 29, 2016, which is hereby incorporated by reference it its entirety.

TECHNICAL FIELD

The present invention relates generally to water-processable n-type semiconductors of polyvinylpyrrolidone (PVP) and carbon nanotubes (CNTs) dispersed in water, into which small amounts of poly(ethyleneimine) (PEI) are added.

BACKGROUND

Organic semiconductors have attracted considerable interest in the last years as potential substitutes for inorganic semiconductors, which are more expensive and difficult to process. Furthermore, organic semiconductors are more flexible and lighter which opens a whole new area of wearable electronics. Of particular interest are organic semiconductors that are solution processable since they are amenable for large scale production and large area applications.

The huge research effort made recently on the development of these materials and their processing has raised the prospect of commercially using organic semiconductors in applications such as organic field-effect transistors (OFETs), organic light-emitting diodes (OLEDs), organic photovoltaic solar cells or organic thermoelectric devices (OTEGs).

Semiconductive materials can be classified in p-type or n-type semiconductors depending if the majority charge carriers are holes or electrons, respectively. Despite the fact that p-type organic semiconductors have achieved great advancement, their n-type counterparts are lagging behind in performance. Doping processes to obtain higher performance n-type organic semiconductors are difficult or make them unamenable to solution-processing. This unfortunate fact has delayed progress on organic semiconductor devices including OFETs, OLEDs, organic photovoltaic solar cells and OTEGs, which require both n-type and p-type materials. Therefore, there is a need for the development of new n-type materials that allow large scale production to improve the performance of organic devices.

In this disclosure, a very simple water-processable n-type semiconductor is shown. This semiconductor comprises polyvinylpyrrolidone (PVP) and carbon nanotubes (CNTs) dispersed in water formulations, into which small amounts of poly(ethyleneimine) (PEI) are added to improve semiconducting properties. The formulations are prepared by mixing the desired amount of PVP, CNTs, PEI and water, following by high power sonication until a good level of dispersion is achieved.

SUMMARY OF THE INVENTION

In accordance with the purposes and benefits described herein, a new and improved water-processable n-type organic semiconductor is provided comprising an aqueous processed polyvinylpyrrolidone/multiwalled carbon nanotube/poly(ethyleneimine) composite (PVP/MWCNT/PEI composite). A method of using a PVP/MWCNT/PEI composite in n-type semiconductor applications is also disclosed. Thermoelectric power generator devices that scavenge waste heat and include a PVP/MWCNT/PEI composite based n-type semiconductor are also envisioned. Thermoelectric Peltier (solid-state) cooling devices that include a PVP/MWCNT/PEI composite based n-type semiconductor are also envisioned.

The water-processable n-type semiconductor described herein is comprised of a composite film, the composite film itself being comprised of polyvinylpyrrolidone (PVP), carbon nanotubes (CNTs) and poly(ethyleneimine) (PEI). In some embodiments, the CNTs are multiwalled CNTs (MWCNTs). The MWCNTs may be graphitized.

The semiconductor may further a substrate, such as a polymer film or a ceramic plate. The substrate may also be connected to a means for conducting electricity and the composite film may be in contact with a surface of the substrate.

CNTs may comprise between about 10 to 70 percent by weight of the composite film. PVP may comprise between about 30 to 70 percent by weight in ratio to CNTs. PEI may comprise between about 0.01 to 0.1 percent by weight in ratio to CNTs. PEI in proportion to CNT may be at a ratio of between 0.001 and 0.9.

In some embodiments, the composite film further comprises a hydrophilic solution, such as water.

In other embodiments, an electrode may be in contact with the composite film. Electrodes may include source, drain or gate electrodes.

Further contemplated is thermoelectric device comprising the water-processable n-type semiconductor. Such a device may also include a p-type semiconductor, a substrate and a means for conducting electricity.

Also provided are methods for making the semiconductor that include steps of adding PVP, CNTs and PEI to a container holding water to form a mixture, mixing the mixture and applying the mixture to a surface to form a film. The mixture may be mixed by sonication. The mixture may be applied by spray coating, painting, or inkjet printing. The applied mixture may then be dried.

BRIEF DESCRIPTION OF THE DRAWINGS

FIGS. 1a-1c show thermoelectric properties of PVP/MWCNT composite films. PVP acts as a donor, changing the majority carriers from holes to electrons, achieving an n-type power factor of 0.86 $\mu Wm^{-1}K^{-2}$. FIG. 1a shows electrical conductivity, FIG. 1b shows Seebeck coefficient and FIG. 1c shows power factor.

FIG. 2a shows Electrical conductivity, FIG. 2b shows Seebeck coefficient and FIG. 2c shows power factor.

FIGS. 3a-3c show a time study of the thermoelectric properties of PVP/MWCNT, PVP/GrMWCNT, PVP/MWCNT/PEI and PVP/GrMWCNT/PEI films. All samples were measured 1, 7, 14 and 21 days after preparation. Points appear slightly displaced along the x-axis to evade overlap of error bars and increase clarity. Both electrical conductivity and Seebeck coefficient remained practically constant after 21 days in air in a controlled atmosphere room. The best n-type power factor is obtained for the PVP/GrMWCNT/PEI films. FIG. 3a shows Electrical conductivity, FIG. 3b shows Seebeck coefficient and FIG. 3c shows power factor.

FIGS. 4a-4e show the chemical structures of the different polymers used. FIG. 4a shows PVP, FIG. 4b shows PVA, FIG. 4c shows PAN, FIG. 4d shows gum arabic (GA) and FIG. 4e shows PEI.

FIG. 8a shows TGA analysis of PVP, MWCNT and PVP/MWCNT/PEI film. FIG. 8b shows DSC curves of PVP and PVP/MWCNT/PEI film

DETAILED DESCRIPTION

The present invention provides a water-processable n-type semiconductor of a composite film of polyvinylpyrrolidone (PVP), poly(ethyleneimine) (PEI) and carbon nanotubes (CNTs). The film is formed by dispersing the PVP and CNTs in water formulations, into which comparatively small amounts of poly(ethyleneimine) (PEI) are added to improve semiconducting properties. The formulations are prepared by mixing the desired amount of PVP, CNTs, PEI and water, following by high power sonication until a good level of dispersion is achieved. The resulting mixture is then applied to a surface, such as by spray coating, inkjet printing and painting, and allowed to dry. The resulting film functions as a n-type semiconductor.

The CNTs of the composite film can be multiwalled CNTs (MWCNTs) or single walled CNTs (MWCNTs). The CNTs may be graphitized and/or acid treated to remove catalytic impurities. The CNTs may comprise between 10 and 90 percent by weight of the composite film. In some embodiments, CNT concentration comprises between about 30 to about 40 weight percent of the composite film.

The PVP may comprise between 90 and 10 percent by weight of the composite film. PEI may comprise between 0.0001 and 10 percent by weight of the composite film.

The composite film functions as a n-type semiconductor and, as such, can be used in thermoelectric applications. Further, as the composite film is derived from an applied solution, the shape, length and thickness can vary widely depending on the intended use of the n-type semiconductor.

The present invention further provides a straightforward and scalable spray coating method for the fabrication of composite thin films based on this material. The as prepared formulations were sprayed on polyethylene terephthalate (PET) substrates using a hand-aerosol spraying kit. Useful substrates for this process include substantially any low-thermal conductivity, electrically-insulating substrates including polymers, such as polyimide and polyethylene terephthalate, and ceramics, such as glass. During the spraying process the substrates were kept at between about 80 and 100° C. to improve solvent evaporation.

The thermoelectric (TE) performance of these films was tested as a potential application. TE power generation is a promising technology that can directly convert waste heat into electricity. TE generators are usually composed of numerous n-type and p-type couples. The performance of the TE materials is usually evaluated by the dimensionless figure of merit, ZT, defined as $ZT=S^2\sigma T/\kappa$, where S, $\sigma$, T and $\kappa$ denote the Seebeck coefficient, electrical conductivity, absolute average temperature and thermal conductivity, respectively. The ZT numerator, $S^2\sigma$, described as the power factor (PF), is also commonly used as a performance parameter.

Figure 1B:
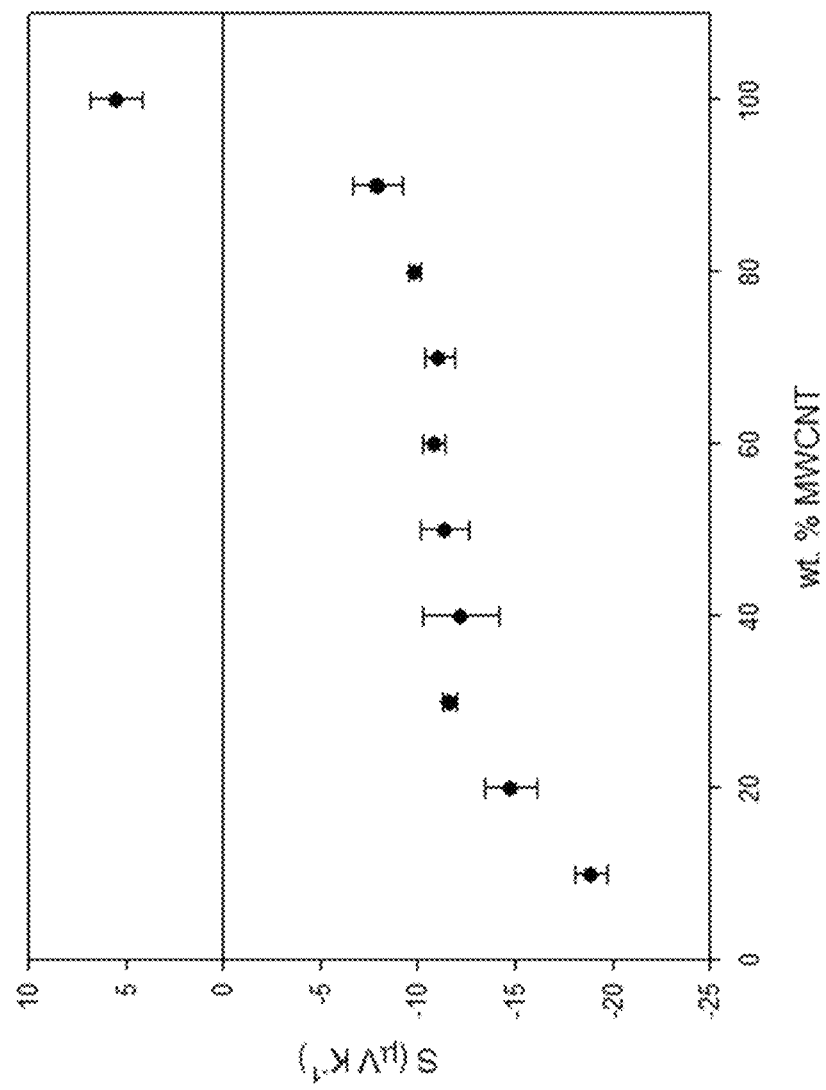
Figure 1C:
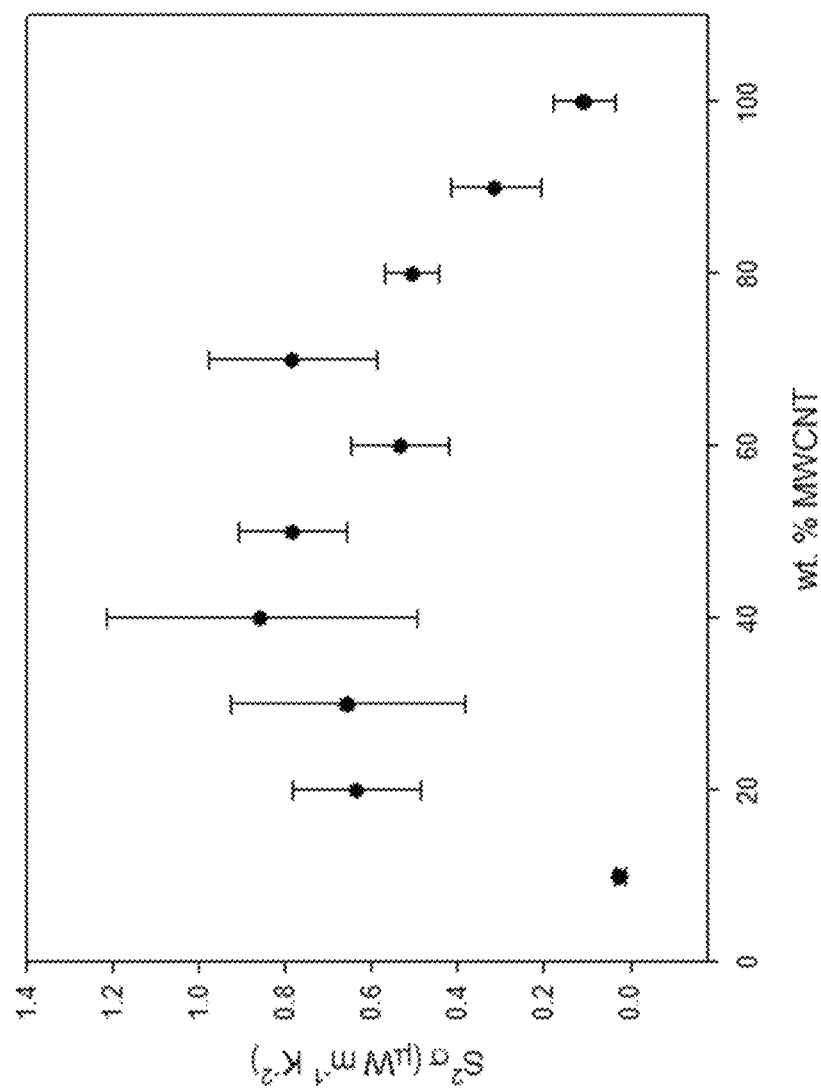

FIG. 1b presents the Seebeck coefficient of prepared PVP/CNT films. The PVP/CNT films are n-type even when the CNT concentration is as high as 90 wt. % as denoted by the change from positive to negative of the Seebeck coefficient sign. The upper black dot represents a 100 wt. % CNT film. FIG. 1c shows the PFs of the PVP/CNT films. The maximum n-type PF obtained is 0.86 $\mu Wm^{-1}K^{-2}$ for the composite film containing 40 wt. % CNTs in PVP.

Figure 2A:
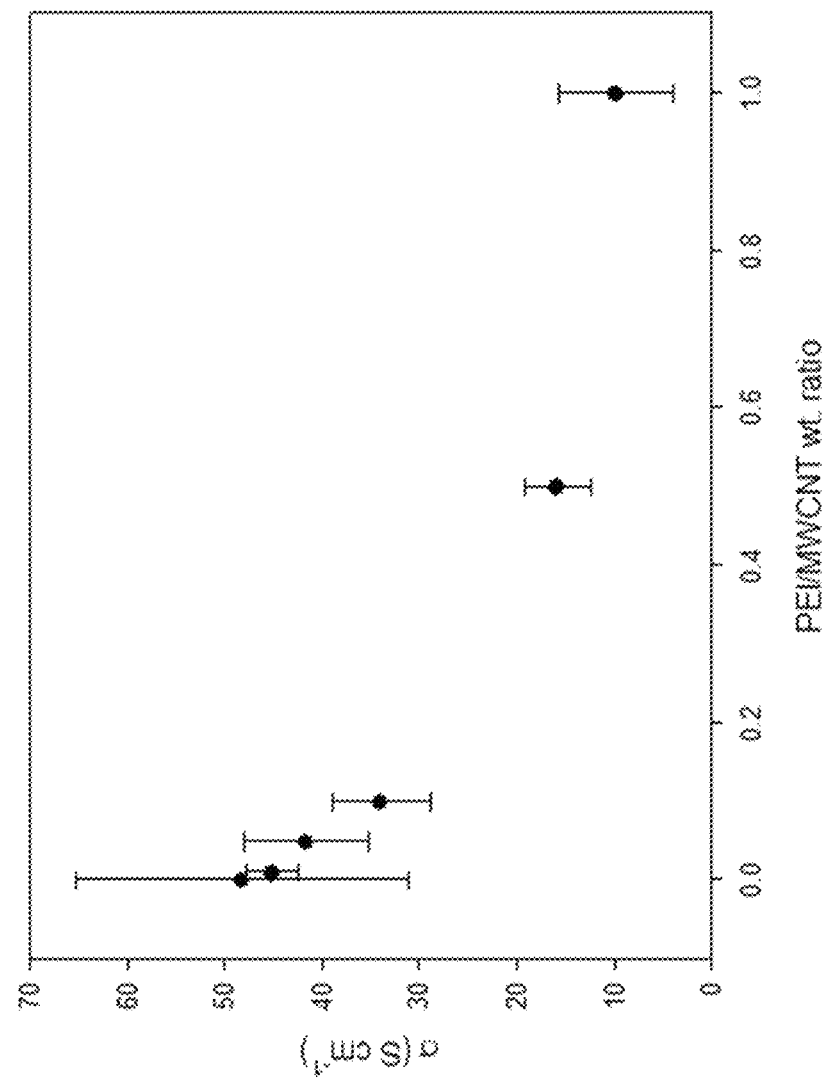
FIGS. 2a-2c show thermoelectric properties of 30 wt. % MWCNTs in PVP films with increasing PEI/MWCNT wt. ratio. A significant increase in the absolute Seebeck coefficient occurred when low concentrations of PEI were added, leading to an n-type power factor 3 times higher than when PEI was not present.
Figure 2B:
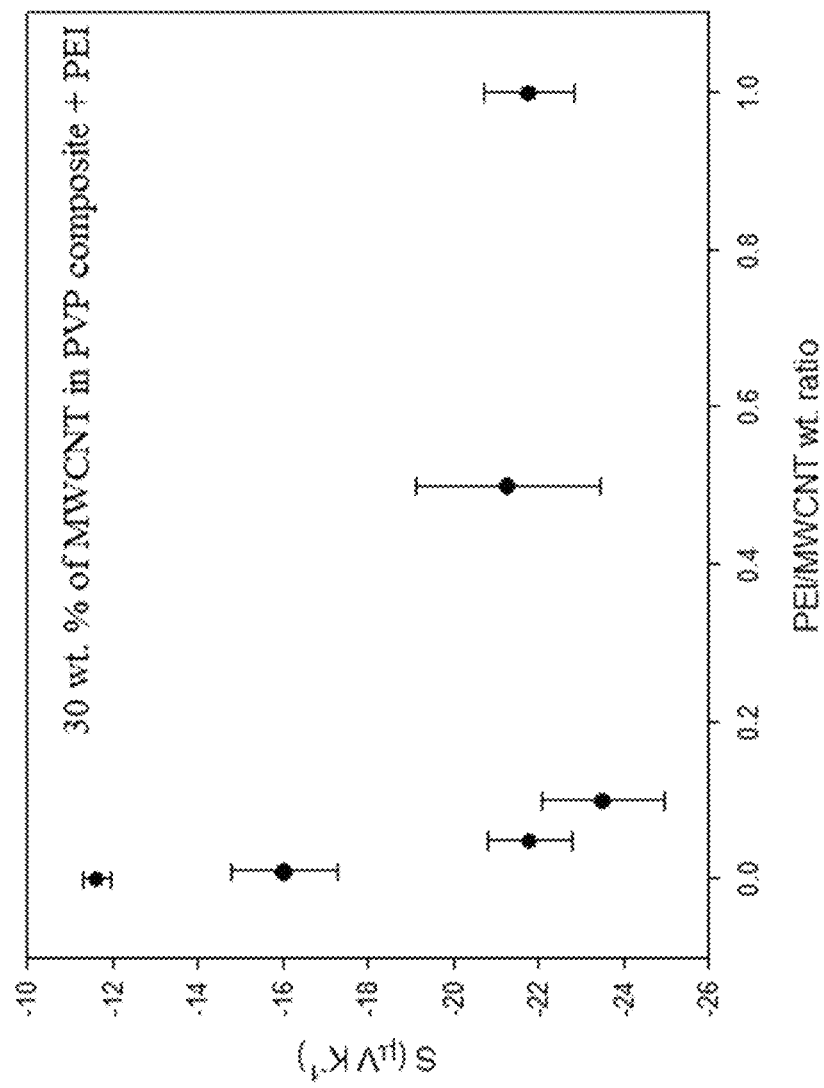
Figure 2C:
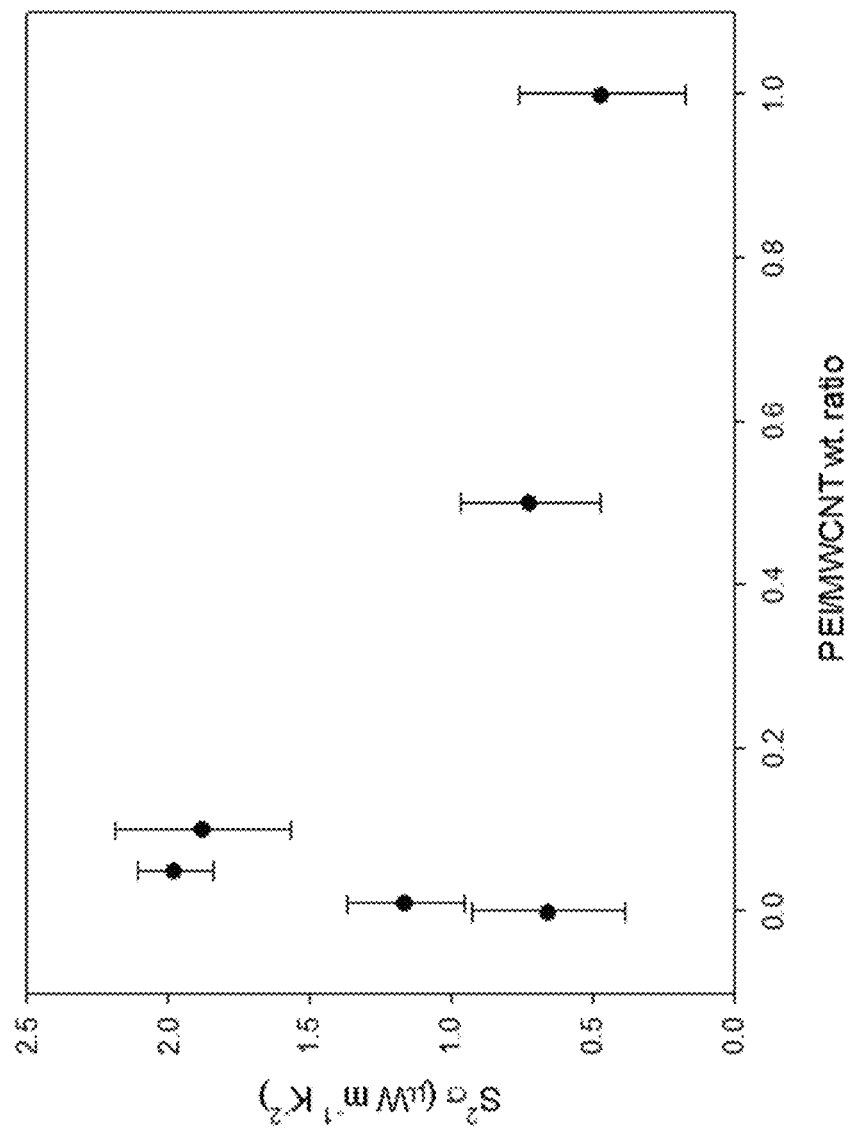

FIG. 2b and FIG. 2c show the Seebeck coefficients and power factors (PFs) of the film containing 30 wt. % of CNTs in PVP when different quantities of PEI are added to the formulation. The Seebeck coefficient not only remains n-type, but increases in absolute value when extremely low quantities of PEI are added. As a result, PFs of the films are increased, peaking at a PF of 1.97 $\mu Wm^{-1}K^{-2}$ for a film containing 30 wt. % of CNTs in PVP and 0.05:1 PEI:CNTs wt. ratio.

EXAMPLES

Ubiquitous potential for waste heat energy scavenging has motivated increasing interest in new thermoelectric (TE) power generation materials. The TE material performance is evaluated by the dimensionless figure of merit, ZT, defined as $ZT=S^2\sigma T/k$, where S, $\sigma$, T and k denote the Seebeck coefficient, electrical conductivity, average absolute temperature and thermal conductivity, respectively. The power factor (PF), $S^2\sigma$, is also commonly used as a performance parameter since it is directly related to the usable power that can be achieved. Hence, in order to achieve high TE performance, high S, high s and low k are desirable. However, these parameters are heavily interrelated and optimization is challenging (Snyder et al. Nat Mater. 2008; 7(2):105-14).

New organic TE materials have garnered great interest due to their flexibility, low thermal conductivity and relative abundance, which make them relatively inexpensive (Bubnova et al. Nat Mater. 2011; 10(6):429-33; Hokazono et al. J Electron Mater. 2014; 43(6):2196-201; Russ et al. Adv Mater. 2014; 26(21):3473-7; Wan et al. Nat Mater. 2015; 14(6):622-7). Despite this interest, these materials are still less efficient than their inorganic counterparts. Although p-type organic materials have experienced a considerable advancement in the last few years (Kim et al. Nat Mater.

2013; 12(8):719-23; Culebras et al. Materials. 2014; 7(9): 6701), development of n-type organic TE materials has lagged. This has been in part due to their air-instability and the difficulty of the doping process, which can render them non-amenable for solution-processing and, thus, mass scale production and large area applications are not viable (Russ et al. Adv Mater. 2014; 26(21):3473-7; Wan et al. Nat Mater. 2015; 14(6):622-7).

Among all approaches considered for high performance n-type organic materials, the most successful has been combining inorganic and organic materials (Wan et al. Nat Mater. 2015; 14(6):622-7; Fukumaru et al. Scientific Reports. 2015; 5:7951; Sun et al. Adv Mater. 2012; 24(7): 932-7; Barbot et al. J Mater Sci. 2012; 48(7):2785-9). Unfortunately, these materials are not solution-processable, therefore limiting their application. Recent studies have also investigated doped small molecules and conductive polymers as a promising approach to obtain solution-processable n-type organic materials (Russ et al. Adv Mater. 2014; 26(21):3473-7; Schlitz et al. Adv Mater. 2014; 26(18):2825-30; Shi et al. J Am Chem Soc. 2015; 137(22):6979-82). However, from a processing point of view, much simpler systems are required in order to keep the production costs low despite the decrease in performance.

A simpler, cost-effective and promising approach to n-type organic solution-processable TE materials is the utilization of doped carbon nanotubes (CNTs) in various ways. Nonoguchi et al. (Adv Funct Mater. 2016; 26(18): 3021-8) recently demonstrated the high n-type thermoelectric performance (ZT~0.1) of SWCNTs doped with a series of ordinary salts which also displayed great air stability. Additionally, different authors have investigated the thermoelectric properties of singlewall CNTs (SWCNTs) treated with different doping molecules or polymers. While SWCNTs usually exhibit p-type behavior due to air induced oxygen doping, it has been reported that polymers or molecules with electron donor groups such as poly(vinylpyrrolidone) (PVP), poly(ethyleneimine) (PEI) and triphenylphosphine (tpp) can decorate the walls of the SWCNTs, and are able to change the majority charge carriers from holes to electrons, causing the Seebeck coefficient to change sign from positive to negative (Collins et al. Science. 2000; 287(5459):1801-4; Piao et al. Physica Status Solidi (B) Basic Research. 2012; 249(12):2353-6; Nonoguchi et al. Scientific Reports. 2013; 3:3344; Ryu et al. Carbon. 2011; 49(14):4745-51 Freeman et al. PLoS One. 2012; 7(11); Piao et al. Carbon. 2013; 62:430-7; Montgomery et al. Carbon. 2016; 96:778-81). Following this strategy, PFs as high as 8 $\mu Wm^{-1}K^{-2}$ for PEI decorated SWCNTs, 9 $\mu Wm^{-1}K^{-2}$ for PVP decorated SWCNTs and 25 $\mu Wm^{-1}K^{-2}$ for tpp decorated SWCNTs were obtained. Nevertheless, the amount of decorating polymer or molecule used in these studies was small compared to the SWCNTs and therefore relatively high thermal conductivities are expected (Kwon et al. In: Shindé S L, Goela J S, eds. High Thermal Conductivity Materials. New York, N.Y.: Springer New York 2006, p. 227-65). Furthermore, since the SWCNT surfaces are exposed to air due to poor surface coverage, reconversion to p-type material may occur. In order to solve these issues, SWCNT/polymer composites, with sufficient polymer matrix for SWCNT coverage, have great potential. The advantages of these composites are that while they largely conserve the electrical properties of SWCNTs and the thermal properties of the polymer, the Seebeck coefficient can be tuned to moderate n-type values and, moreover, they are flexible and air stable since the SWCNTs are embedded in the polymer matrix. For instance, poly(vinylalcohol) (PVA)/SWCNT/PEI composites reached a S of $-57$ $\mu VK^{-1}$ rendering a PF of 0.04 $\mu Wm^{-1}K^{-2}$. Poly(vinylidene fluoride) (PVDF)/SWCNT/doublewall CNT (DWCNT) films were n-type doped by spraying with a PEI solution obtaining a S of $-32$ $\mu VK^{-1}$ and a PF of 1.47 $\mu Wm^{-1}K^{-2}$. PEI functionalized SWCNT composites with polyvinyl acetate matrix and dodecylbenzenesulfonate as the dispersion agent exhibited a Seebeck coefficient as large as $-100$ $\mu VK^{-1}$ and a PF of 8.4 $\mu Wm^{-1}K^{-2}$. More recently, SWCNT/DWCNT/PVDF composite films were used to combine piezoelectric and thermoelectric technologies that showed synergistic effects resulting in increased device performance (Montgomery et al. Appl Phys Lett. 2016; 108(26):263901).

Figure 7:
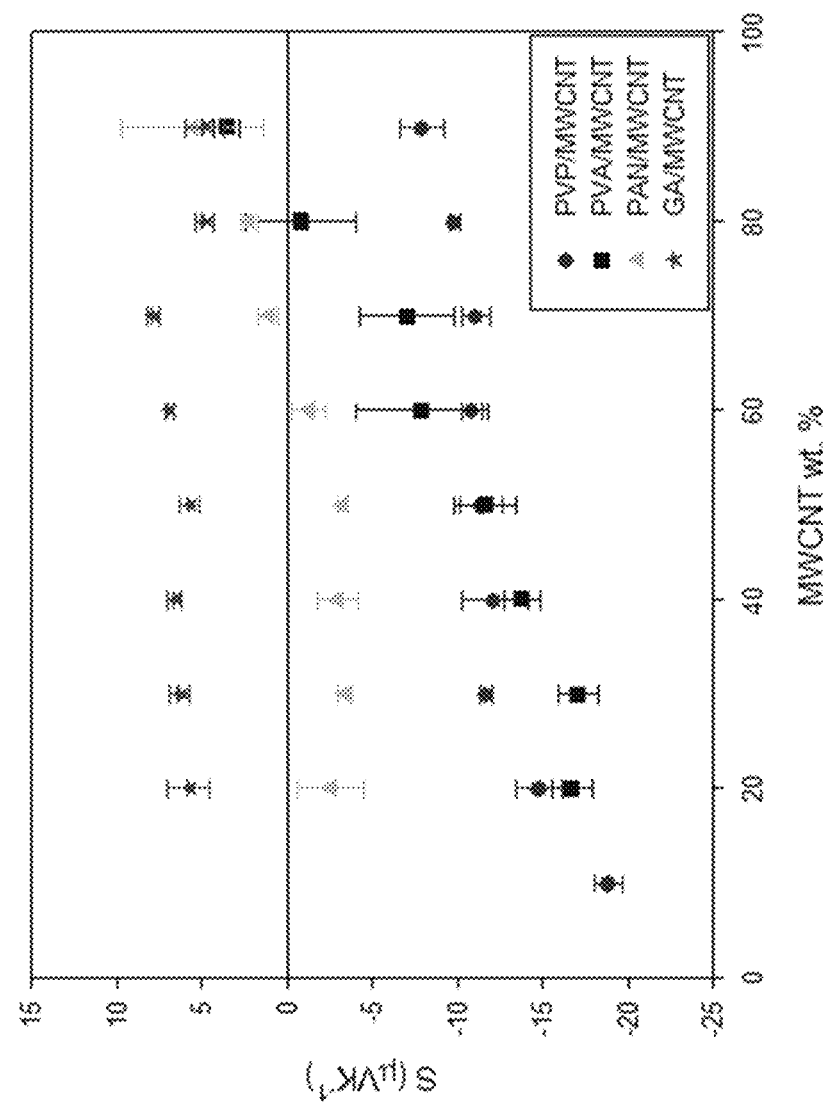
FIG. 7 shows the Seebeck coefficient of polymer/MW-CNT composites. PVP shows n-type behavior over the entire range of concentration, while PVA and PAN change from p-type to n-type at some point. GA remains p-type in all the concentrations studied.

Multiwall CNTs (MWCNTs) are a cheaper alternative to SWCNTs (around 50 to 100 times less expensive). Recently, a solution processable P3HT/MWCNT composite with the ability to switch from p-type to n-type after UV irradiation was presented by Dörling et al. (Adv Mater. 2016:n/a-n/a). The material has great advantages in terms of processability since to fabricate large area devices it is only necessary to cover the area with the starting solution followed by UV irradiation of the masked area. Our group's capabilities include pilot-scale production of aligned MWCNTs using a continuous chemical vapor deposition process (Andrews et al. Chem Phys Lett. 1999; 303(5-6):467-74; U.S. Pat. No. 7,160,531; U.S. Pat. No. 7,504,078). Motivated by the promising potential of SWCNTs, we investigated the n-type thermoelectric response of MWCNTs with different polymers that contain oxygen or nitrogen groups such as PVA, polyacrylonitrile, PVP and gum arabic, and found the best results for PVP (see FIG. 7). Other studies have observed PVP to perform well as n-type dopant polymer for SWCNTs, but little has been done to investigate this in detail. Further, to the best of our knowledge, no reports investigating TE properties of MWCNTs in PVP have been published. In this work, we report for the first time the thermoelectric performance of n-type PVP/MWCNT composites through a wide range of MWCNT concentrations. A simple, low-cost, scalable and environmentally friendly water-solution aerosol spray process was used to make n-type PVP/MWCNT thin films. Furthermore, the effect of adding PEI was also investigated. These composite films showed a significant increase in the n-type Seebeck coefficient resulting in commensurately enhanced TE performance. Additionally, both the stability over time and the effect of removing Fe catalytic impurities from the MWCNTs (stemming from the MWCNT synthesis (Andrews et al. Chem Phys Lett. 1999; 303(5-6):467-74; Andrews et al. Carbon. 2001; 39(11): 1681-7)), using graphitized MWCNTs (GrMWCNTs), were studied showing good stability and an enhancement of the TE properties when Fe was removed from the MWCNTs in the PEI-containing composite films. Finally, the temperature dependence of the thermoelectric properties is also studied and an increase of the power factor with temperature is observed.

Experimental

Figure 6:
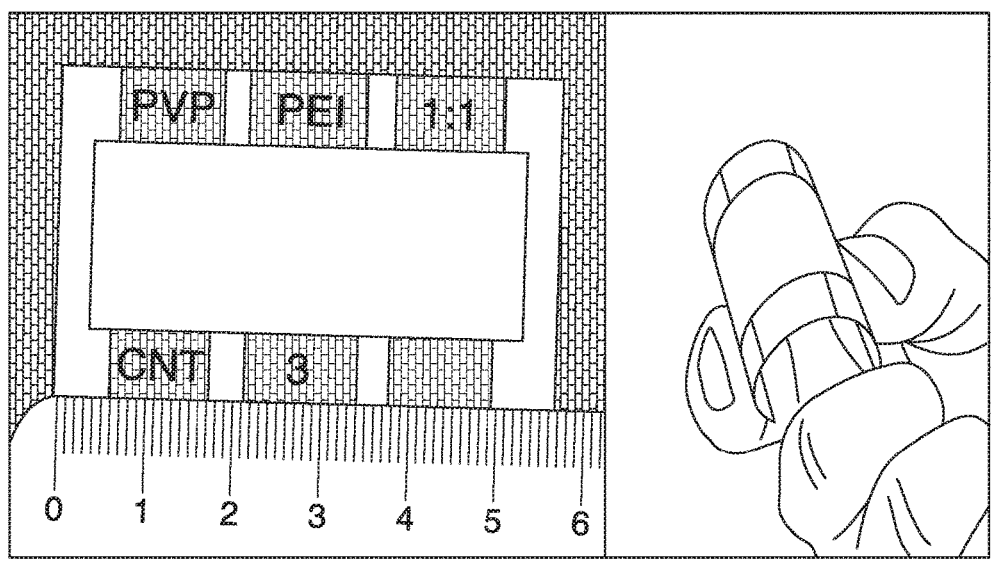
FIG. 6 shows one of the samples prepared showing dimensions and flexibility.
Figure 10B:
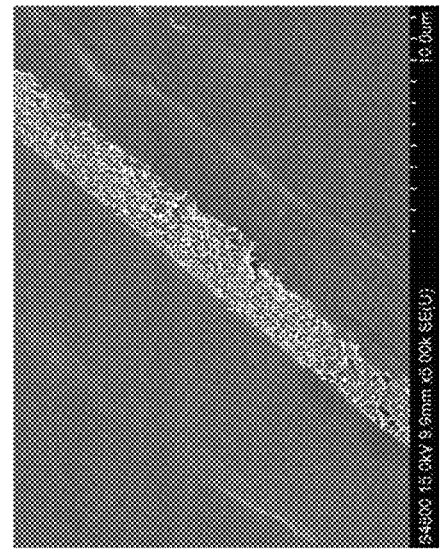
FIG. 10b shows a SEM image showing the cross-sectional area of a 40 wt. % MWCNTs in PVP film.
Figure 10A:
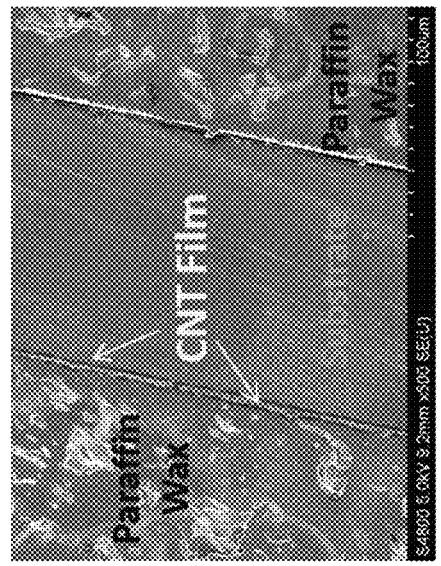
FIG. 10a shows a SEM image indicating components of the cryostat sectioned sample, which allows for measuring the thickness of the nanotube layer.

To prepare the PVP/MWCNT dispersions, scale measured quantities of PVP powder (approx. Mw 40000, Scientific Polymer Products) and MWCNTs were mixed together. The quantity of MWCNTs remained constant at 0.25 g while the quantity of PVP powder was varied in order to achieve the MWCNT concentration desired. Then, 100 g of deionized water (DI water) was added to the mix and bath sonicated (Branson Ultrasonic Cleaner Model B300) for 15 minutes. Mixtures were placed in an ice bath and horn sonicated (Fisher Scientific 550 Sonic dismembrator) at 20% power. For each 30 seconds of sonication, the horn was idled 10 seconds off and the total time on was 30 minutes. In order to improve the wettability of the dispersion on the polyethylene terephthalate (PET) substrate onto which PVP/MWCNT films were sprayed, 80 mL of methanol was added to the dispersion followed by an additional 15 minutes of bath sonication. A MWCNT dispersion was also prepared following the same method but without adding PVP powder. Since the dispersion in the absence of polymer was not stable, it was used immediately after preparation. When studying the effect of PEI (approx. Mw 60000, 50 wt. % water solution of branched PEI), the quantity of PEI/water solution necessary to achieve the desired PEI/MWCNT wt. ratio was added at the same time as MWCNT and PVP powder. Before spraying, PET substrates were lightly sanded with 240 grit sand paper and four gold contacts were sputter coated on them. Once the dispersions and the PET substrates were ready, the spraying process was performed keeping the substrate horizontal, and at an approximate temperature of 100° C. to facilitate solvent evaporation. In order to prepare the films containing GrMWCNTs the same procedure described above was followed adding GrMWCNTs instead of MWCNTs. Dried films were flexible and approximately 5 cm long and 1.5 cm wide (see FIG. 6) and had thicknesses between 1-2 mm measured by SEM imaging (see FIG. 10).

Figure 11:
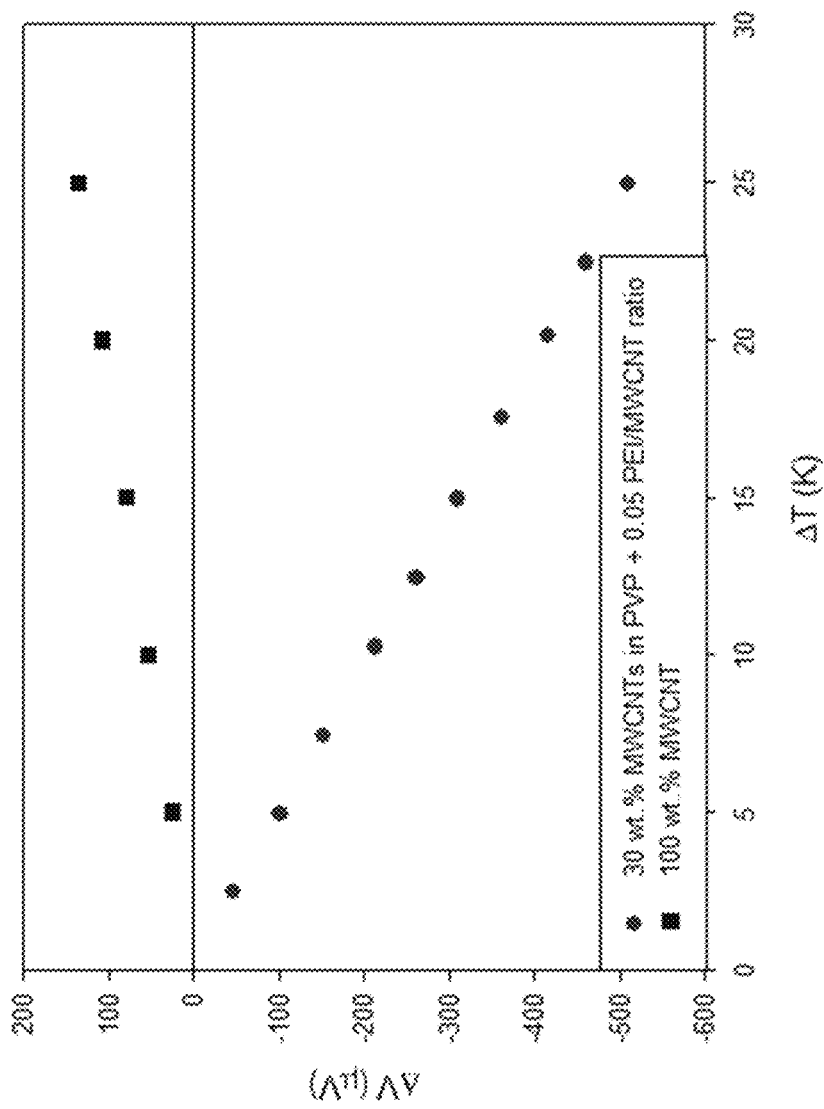
FIG. 11 shows an example of ΔV-ΔT plot for two of the samples prepared. The slope of each line is the Seebeck coefficient of each sample. The positive slope of the 100 wt. % MWCNT film indicates its p-type behavior while the negative slope of the 30 wt. % MWCNTs in PVP and 0.05 PEI/MWCNT wt. ratio indicates n-type behavior.

Electrical conductivities of the samples were measured using a four-point probe resistance method, passing a current (Lambda LP-412A-FM power source) through the two outer contacts and measuring the voltage (Greenlee DM-40 voltmeter) difference between the inner ones. The resistance of the film was extracted from the slope of the current-voltage lines and a geometrical factor was applied to calculate the electrical conductivity. Seebeck coefficients were determined by the slope of the linear relationship between the thermal electromotive force and the temperature difference between the two ends of each film (see below and FIG. 11). The average values and standard deviation presented were calculated from three different samples, except in the time study, where they were calculated from nine different samples.

Results and Discussion

FIGS. 1a and 1b show the electrical conductivity and Seebeck coefficient of the PVP/MWCNT composite films measured at room temperature. When MWCNTs are introduced into the PVP matrix, the electrical conductivity increased from 0.65 Scm$^{-1}$ at 10 wt. % MWCNTs, to 63 Scm$^{-1}$ at 70 wt. % MWCNT. This value was higher than that for the pure MWCNT film (35 Scm$^{-1}$). Further, a noticeable change in the sign of the Seebeck coefficient occured as shown in FIG. 1b with the addition of PVP. A 90 wt. % MWCNT/PVP film exhibited n-type behavior with S=−7.9 µVK$^{-1}$ while the 100 wt. % MWCNT film showed p-type behavior, as expected, with S=5.5 µVK$^{-1}$. The Seebeck coefficient decreased in value to −18.9 µVK$^{-1}$ at as low as 10 wt. % MWCNTs in the PVP film. However, lower MWCNT concentrations rendered films with ever lower electrical conductivities, and measurement of Seebeck coefficient and electrical conductivity could not be performed accurately. These results demonstrate that PVP is able to change the majority charge carriers of MWCNTs from holes to electrons, even when the concentration of MWCNTs is as high as 90 wt. %. PVP possesses a nitrogen heteroatom in the pendant group that could act as a potential electron donor. PVP chains could be adsorbing on the outer walls of the MWCNTs forming charge-transfer complexes facilitating the acceptance of electrons by MWCNTs (e.g. Rastegaralam et al. Physica Status Solidi (C) Current Topics in Solid State Physics. 2013; 10(7-8):1183-7). This process of electron acceptation results in a change of the overall semiconducting behavior from p-type to n-type. Further injection of electrons into the MWCNTs results in an increase of electrical conductivity with respect to the pure MWCNTs. When the MWCNT concentration is lower than 30 wt. %, the electrical conductivity decreases rapidly and the Seebeck coefficient increases in absolute value. In this domain (10 to 30 wt. %) the quantity of insulating polymer between MWCNTs is presumably high and, therefore, charge carrier transport between tubes is impeded, decreasing the charge carrier mobility. These insulating polymer barriers may also be leading to charge carrier localization and energy filtering effects that result in an increase of the absolute value of S when the size of the barriers is augmented since low energy carriers will not be able to pass through. FIG. 1c shows the PFs of these films. The PF reaches a maximum value of 0.86 µWm$^{-1}$K$^{-2}$ at 40 wt. % MWCNTs. This is a relatively high and very promising n-type PF for an extremely simple, low-cost, water-processed system. Here, it must be noted that PF values for samples 20, 30, 40, 50 and 70 wt. % MWCNTs are not statistically different and, therefore, using lower concentrations of MWCNTs might be prioritized.

Additionally, PEI has been shown to be an effective n-type dopant for SWCNTs, as it adsorbs on SWCNT walls and donates its lone electron pair from the amine groups of its backbone (Yu et al. Energy and Environmental Science. 2012; 5(11):9481-6). In the previously referenced studies, PEI/SWCNT composites containing high amounts of SWCNTs suffered from relatively high thermal conductivities. Studies where PEI has been incorporated into polymer/SWCNT composites have been performed in order to lower the thermal conductivity (e.g. Hewitt et al. J Appl Phys. 2014; 115(18)). However, the polymers chosen as a matrix in these studies were unable to donate electrons and the composites always showed p-type behavior prior to the addition of PEI. Here, we report the effect of adding PEI to a PVP/MWCNT composite film, where PVP already acts as an n-type dopant capable of changing the semiconducting behavior from p-type to n-type. A PVP/MWCNT composite film containing 30 wt. % MWCNTs was chosen to perform these series of experiments due to its previously shown high power factor. Although any sample between 20, 30, 40, 50 and 70 wt. % could have also been used, we chose 30 wt. % as an initial optimal MWCNT concentration. FIGS. 2a and 2b show the electrical conductivity and Seebeck coefficient of the PVP/MWCNT/PEI composite films for different PEI/MWCNT wt. ratios (0.01, 0.05, 0.1, 0.5 and 1). While adding PEI results in a decrease in the electrical conductivity (FIG. 2a), adding exceedingly low concentrations of PEI resulted in a significant increase in the absolute Seebeck coefficient achieving values as high as −23.5 µVK$^{-1}$ for a 0.1 wt. ratio (0.1:1 wt/wt PEI to MWCNTs) (FIG. 2b). This behavior differs from that reported by other authors, where adding PEI increased the electrical conductivity while effectively changing the Seebeck coefficient from p-type to n-type. In those cases, the polymer/SWCNT composites were p-type and PEI acted as an n-type dopant injecting electrons into the SWCNTs, changing the majority charge carriers from holes to electrons and increasing the electrical conductivity due to the increased charge carrier concentration. However, in our work, PVP/MWCNT composites are already n-type, and in this environment the PEI seemed to act rather as a trap than as a dopant. For instance, the high density of amine groups containing lone pairs of electrons can be effective scattering points for conduction electrons, reducing their mobility and therefore, reducing the electrical conductivity. Moreover, the energy dependent nature of the scattering points can lead to energy filtering effects, which is evident in the increase in the negative value of the Seebeck coefficient (Narducci et al. J Solid State Chem. 2012; 193:19-25; Zhang et al. Nano Energy. 2015; 13:327-35; Minnich et al. Energy & Environmental Science. 2009; 2(5):466-79). In FIG. 2c the PFs of the PVP/MWCNT/PEI films are shown. The energy filtering effect compensates the reduced mobility leading to a maximum n-type PF of 1.98 $\mu Wm^{-1}K^{-2}$ for a composite film containing 30 wt. % MWCNTs in PVP and 0.05 PEI/MWCNT wt. ratio. This PF is 3 times higher than the same composite film without PEI. Furthermore, this PF is in the same order of magnitude that those for n-type SWCNT composites (8.4 $\mu Wm^{-1}K^{-2}$, 1.47 $\mu Wm^{-1}K^{-2}$) but using MWCNTs that are 50-100 times less expensive. The thermal conductivity of these films was estimated to be approximately 1.4 $Wm^{-1}K^{-1}$ yielding a ZT of $4 \cdot 10^{-4}$ at 300 K.

Figure 3A:
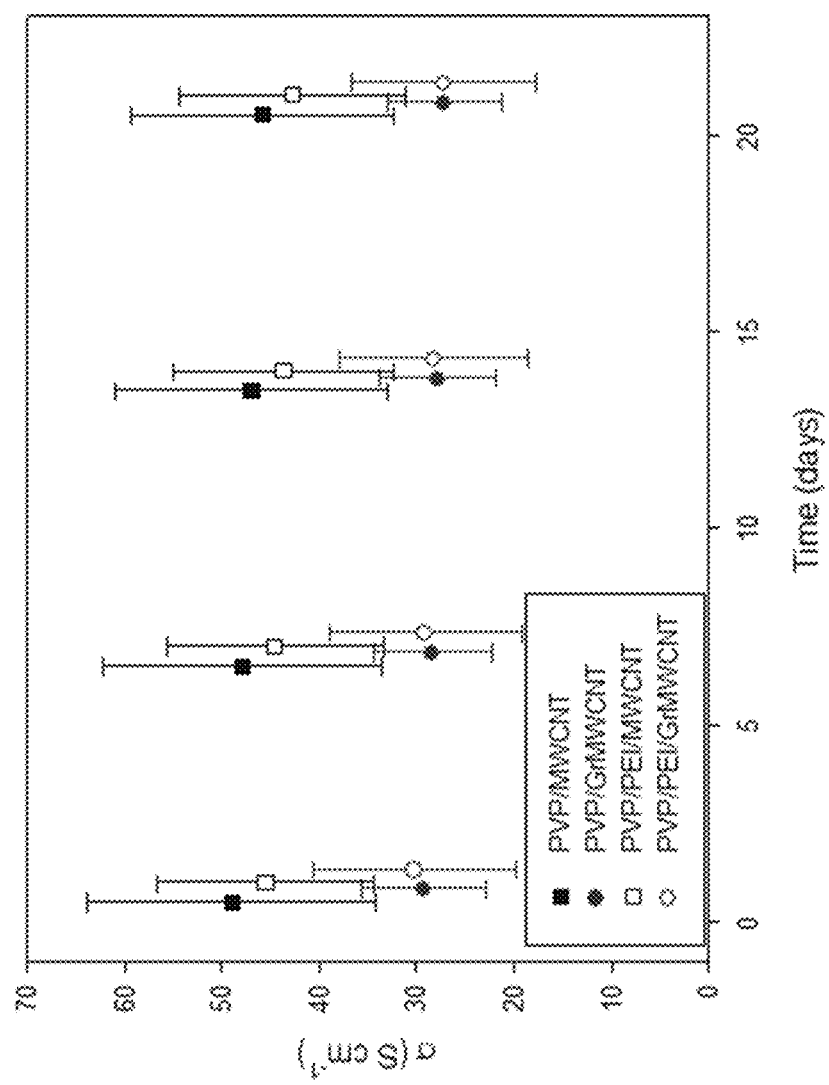

In order to study the stability of the n-type behavior of the films in an air atmosphere, three separate dispersions, from which sample films were spray coated, and three sample films per dispersion were prepared from scratch (see below) for a total of nine samples per film studied over time. These samples were stored and measured in a room with controlled humidity (0.5% relative humidity) and temperature (21° C.) over a period of 21 days. Two of the formulations chosen for the study were PVP with 30 wt. % MWCNTs (with respect to PVP) without PEI, and with 0.01 PEI/MWCNT wt. ratio. In addition, a TGA analysis was performed on the MWCNTs which showed a residual Fe catalyst content of 16.82 wt. % (see FIG. 5). Since Fe may affect TE properties of the films, identical film compositions as described above were studied using graphitized MWCNTs (GrMWCNTs) with no detectable residual Fe catalyst. The TE properties of all the films remained quite constant with respect to time. While σ decreased slightly (FIG. 3a), S increased in absolute value (FIG. 3b), resulting in a constant or slightly higher PF (FIG. 3c). The study also revealed that Fe was indeed affecting the TE properties of the films. Composites prepared with MWCNTs had higher σ than those prepared with GrMWCNTs. Thermal treatment of MWCNTs in order to remove catalytic impurities has been reported to decrease defects, increasing crystallinity and improving σ and, therefore, the decrease in σ seems to be due to removal of Fe (Delpeux-Ouldriane et al. Carbon. 2006; 44(4):814-8; Jin et al. Physica B: Condensed Matter. 2007; 388(1-2):326-30). In the case of PVP/MWCNT composites, the removal of Fe resulted in both the decrease of σ and the absolute value of S, which might be indicative of Fe playing a role in the ability of PVP to inject electrons to the MWCNTs. However, when PEI was present, the removal of Fe had opposite effects on σ and S, decreasing the former but increasing the absolute value of the latter. Further work is necessary to better understand the role of Fe in the TE performance of this material. The highest PF for composites without PEI is found when adding MWCNTs, however, when PEI is also present the highest PF was found when adding GrMWCNTs. Nevertheless, the best PF among all of them is found for PVP/PEI/GrMWCNTs composites.

Figure 8A:
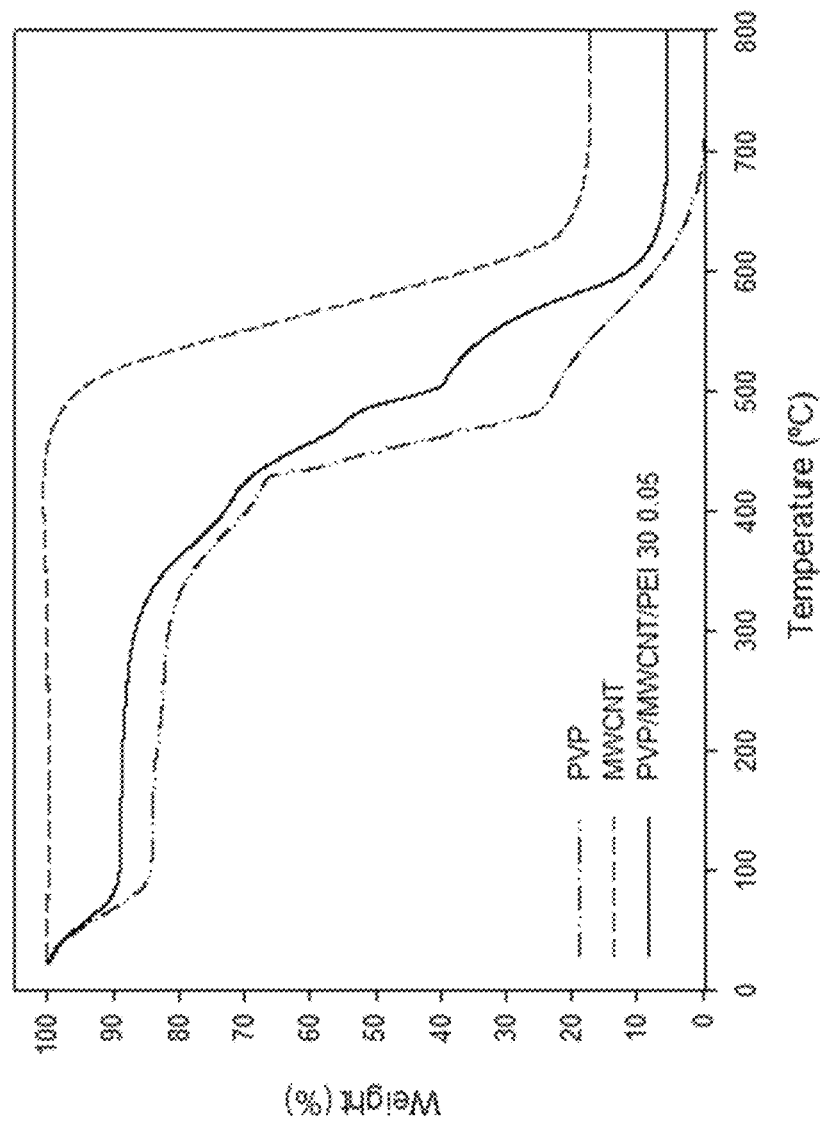
FIGS. 8a-8b show a thermal stability study of PVP/MWCNT/PEI films.

Finally, we studied the thermal stability of the films and the temperature dependence of the thermoelectric properties. FIG. 8a shows the thermogravimetric curves in air of MWCNT, PVP and a film containing 30 wt. % of MWCNTs in PVP and 0.05 PEI/MWCNT wt. ratio. The MWCNT curve shows the characteristic step between 500° C. and 650° C. and a residue of 17 wt. % corresponding to the Fe catalytic impurities (Bom et al. Nano Lett. 2002; 2(6):615-9). The PVP curve has an initial descend corresponding to the dehydration of the material indicating a water content of approximately 15 wt. %. The thermal degradation of PVP starts at a temperature of 250° C. due to the formation of peroxides that decompose at relatively low temperatures (Peniche et al. J Appl Polym Sci. 1993; 50(3):485-93). The degradation curve of the films shows a contribution from both components. A content of 10 wt. % of water is suggested by the diagram due to the hygroscopic nature of PVP. Additionally, a residue of about 5.6 wt. % is observed stemming from the catalytic impurities of the MWCNTs. Mimicking the thermal degradation of PVP, the films start to lose weight at 350° C. due to degradation.

Figure 8B:
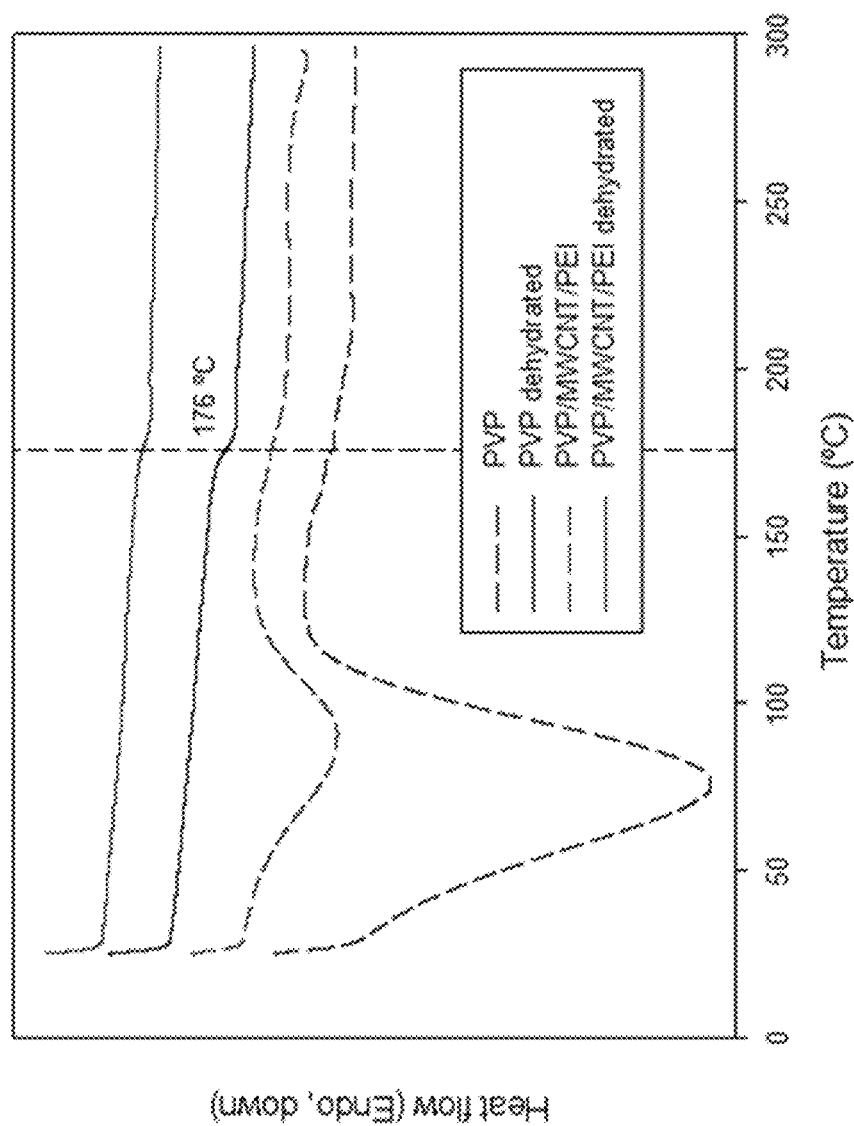

The differential scanning calorimetry (DSC) curves of PVP and a 30 wt. % of MWCNT in PVP and 0.05 PEI/MWCNT wt. ratio film are shown in FIG. 8b. An endothermic peak corresponding to the dehydration of the materials is observed at 75° C. and 90° C. (minimum position) for PVP and the film, respectively. The same peak is not observed in the dehydrated samples. Additionally, the glass transition is much better defined in the dehydrated curves and occurs at a temperature of 176° C. for both materials.

Figure 9:
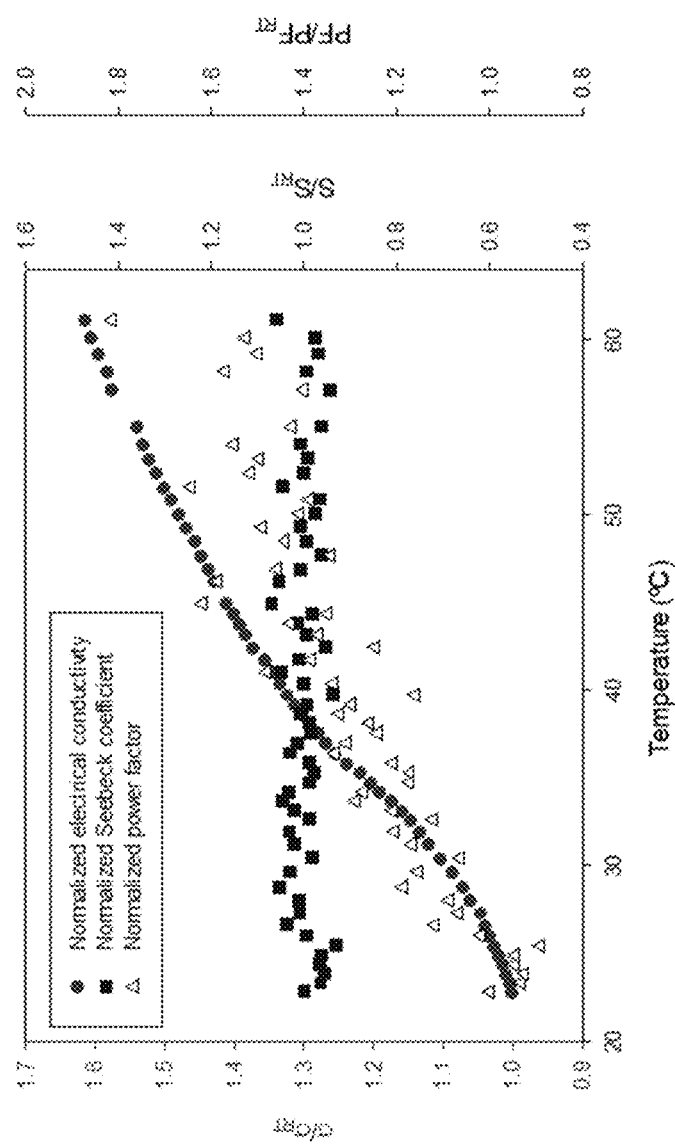
FIG. 9 shows temperature dependence of the normalized thermoelectric properties of 30 wt. % MWCNTs in PVP films and 0.05 PEI/MWCNT wt. ratio. The increase in electrical conductivity with increasing temperature and the constant Seebeck coefficient yield and increase in power factor up to 1.6 times higher at 60° C.

FIG. 9 shows the temperature dependence of the thermoelectric properties of the film containing 30 wt. % of MWCNTs in PVP and 0.05 PEI/MWCNT wt. ratio for a range between 23° C. and 60° C. The properties are normalized to the value at room temperature (RT). The Seebeck coefficient is constant in the studied range. However, the normalized electrical conductivity increases with increasing temperature up to a value 1.6 higher than the RT value. Therefore, the power factor also increases with increasing temperature up to values approximately 1.6 higher than the RT value at 60° C. We believe that the observed increase in electrical conductivity is due to the dehydration of the film and consequent water loss that the TGA analysis suggested.

The results here reported demonstrate that PVP/MWCNT composites showed n-type behavior over a wide range of compositions and can act as an n-type thermoelectric material. The TE properties were enhanced by adding low concentrations of PEI resulting in PFs on the same order as SWCNTs/polymer composites, but using much cheaper MWCNTs. Moreover, there is still room to improve the TE performance by optimizing the composition of the composites, and by studying the effect of other dopants. Further studies should be performed in order to better understand the role of residual Fe catalytic impurities, and the trap or dopant nature of PEI. We believe that the simplicity of the system studied, which furthermore, is water-processable, the low cost of the components, and both the thermal and air stability of the material, make PVP/MWCNT composites a promising approach towards n-type organic TE materials.

Materials

Polyvinylpyrrolidone (PVP) powder (approx. $M_w$ 40000), a 50 wt. % solution of branched polyethyleneimine (PEI) (approx. $M_w$ 60000) in water and polyacrylonitrile (PAN) powder (approx. $M_w$ 150000) were purchased from Scientific Polymer Products. Polyvinyl alcohol (PVA) powder, 95% hydrolyzed (approx. $M_w$ 95000) was purchased from Acros Organics and Gum Arabic (GA) powder (approx. $M_w$ 250000) was purchased from Sigma Aldrich. All polymers were used as received without additional treatment. Chemical structures of the different polymers used can be seen in FIG. 4.

The MWCNTs used in this work were synthesized using a continuous chemical vapor deposition (CVD) method. Quartz substrates were passed through the synthesis belt-furnace which was operated at approximately 775° C. A feedstock vapor of ferrocene and xylene was metered into the furnace above the quartz substrates. Iron nanoparticles were deposited on the quartz surface as result of the thermal decomposition of the ferrocene. These nanoparticles are quickly saturated with carbon, precipitating MWCNTs which grow until the carbon vapor can no longer access the iron catalyst nanoparticles. A water-based recovery unit was used to recover the MWCNTs from the substrates upon exiting the synthesis furnace. The MWCNTs were recovered by filtration then dried, sieved and stored for use.

Graphitized MWCNTs (GrMWCNTs) were produced by thermally treating as-produced MWCNTs at 2700° C. for 1 hour, under flowing ultra-high purity helium. This process removes residual iron catalyst particles, in addition to making the individual nanotubes more graphitic, through annealing (Bom et al. Nano Lett. 2(6):615-9 (2002)).

Figure 5:
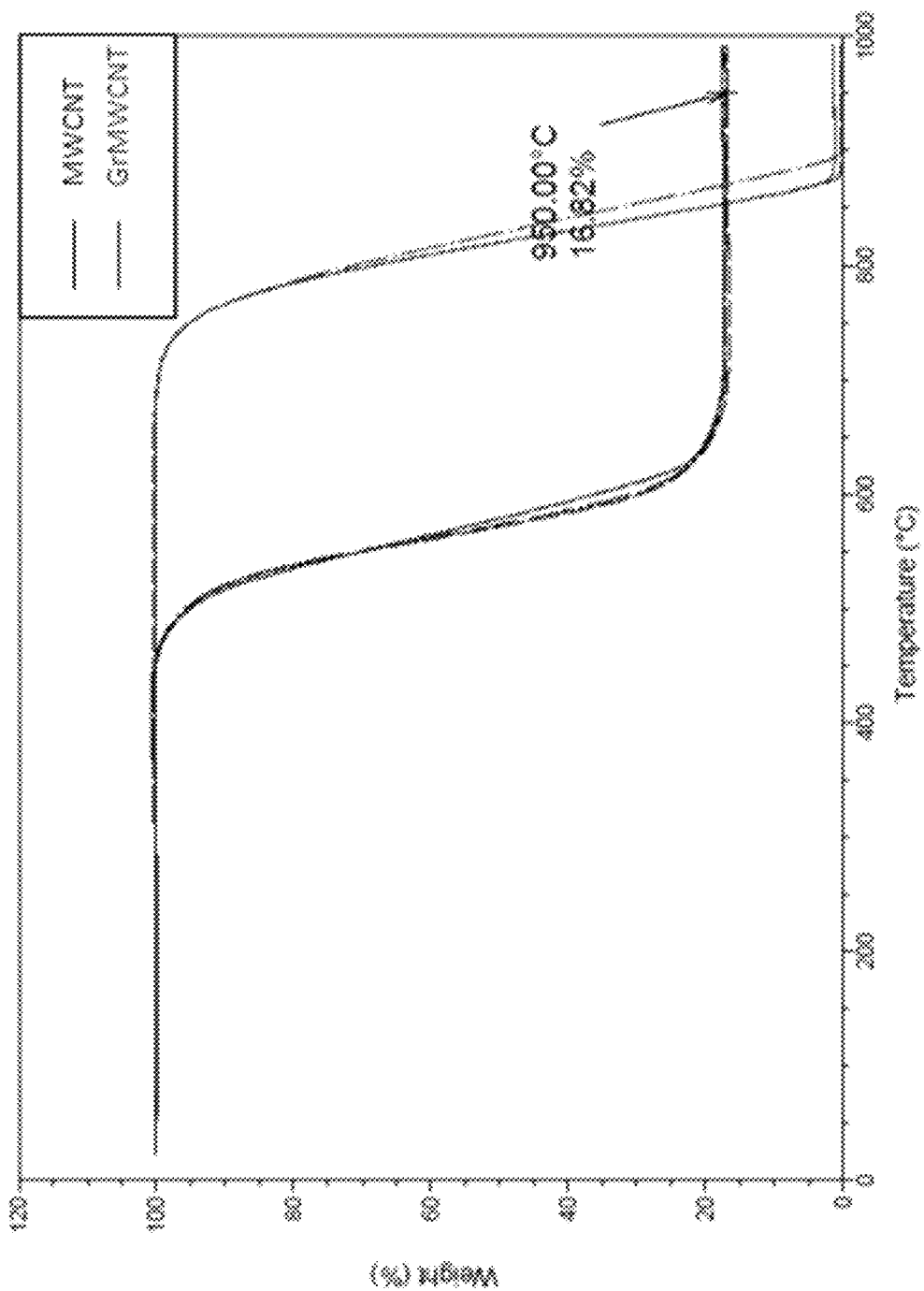
FIG. 5 shows TGA analysis of MWCNTs and GrMW-CNTs. The MWCNT analysis shows a residue of 16.82 wt. % which corresponds to the Fe catalytic impurities. The GrMWCNT analysis shows almost 0 wt. % of impurities.

Thermal gravimetric analysis (TGA, TA Instruments Q500) was performed to quantify the content of Fe in the MWCNTs and GrMWCNTs [4]. Three tests were run per sample at 20° C./min to 1000° C. in air. The results are shown in FIG. 5.

Scanning Electron Microscope

In order to determine the thickness of the nanotube layer deposited on the substrate, each sample (example shown in FIG. 10) had a 1 cm by 1 cm square cut directly from the center of the sample. This effectively destroyed the sample, and was therefore completed last in the characterization steps. The square was then embedded vertically in liquefied paraffin wax (approx. 70° C.). The paraffin wax was allowed to cool, and the sample trimmed at room temperature using a Leica CM1100 cryostat to expose the substrate and nanotube layer. The blade was kept perpendicular to the length of the sample. Finally, the sample was gold sputter coated for 100 s using a Hummer 6.2 Sputter System with a sputtering current of 20 mA and imaged at 15 kV accelerating voltage and 10 μA beam current using the secondary electron detector on a Hitachi S-4800 field emission SEM. Images were taken at 5 k magnification. At least three images were taken along the length of the film. From these three images, the thicknesses of the nanotube layer were measured and averaged for each sample.

Seebeck Coefficient

A micro-voltmeter (Keithley 2110 5½ Digit multimeter) was used to measure the generated voltage difference between the extremes of the film, and temperatures were measured with thermocouples. S was obtained as the slope of $\Delta V$-$\Delta T$ plots (see FIG. 11 for an example plot). Here, $\Delta V$ is measured between the cold side and the hot side ($\Delta V = V_{cold} - V_{hot}$), connecting the positive lead (red) of the voltmeter to the cold side, and the negative lead (black) to the hot side. Thus, it will be a positive number when measuring a p-type sample and negative if measuring an n-type. The temperature difference is defined as $T_{hot} - T_{cold}$, a positive number. Per this approach, the Seebeck coefficient will be positive for a p-type material and negative for an n-type material.

Thermal Conductivity (LFA, mDSC and Bulk Density)

A dispersion prepared following the method described in the main text of the manuscript was allowed to evaporate in an oven at ~70° C. until a solid puck was obtained. Thermal diffusivities were obtained using a Netzsch Laser Flash Apparatus (LFA) 427. The specimen was graphite coated and ran as a single layer under flowing nitrogen. Starting at 25° C., three shots were taken every 25° C. up to 125° C., then three more shots at the same temperatures were taken during cooling.

The heat capacity of the material was measured using modulated scanning differential calorimetry (mDSC, TA Instruments Q100) at the same temperatures indicated in the LFA.

Bulk density was estimated from the geometry and mass of the LFA puck specimen.

Finally, the thermal conductivity was calculated as the product of the thermal diffusivity, heat capacity and bulk density.

PVP Comparison Against Other Polymers

Different films were prepared following the same procedure described in the manuscript using PVA, PAN and GA, with the only difference that for PAN, N,N-dimethylacetamide was used as solvent instead of water. PVA and PAN composites successfully change from p-type to n-type as PVP does while GA composites remain p-type throughout the whole MWCNT concentration range. Even though PVA showed higher negative Seebeck coefficient than PVP at some concentrations, MWCNTs were poorly dispersed in water with PVA rendering significantly lower electrical conductivities.

The foregoing descriptions of various embodiments provide illustration of the inventive concepts. The descriptions are not intended to be exhaustive or to limit the disclosed invention to the precise form disclosed. Modifications or variations are also possible in light of the above teachings. The embodiments described above were chosen to provide the best application to thereby enable one of ordinary skill in the art to utilize the inventions in various embodiments and with various modifications as are suited to the particular use contemplated. All such modifications and variations are within the scope of the invention. All publications, patents and patent applications referenced herein are to be each individually considered to be incorporated by reference in their entirety.

The invention claimed is:

1. A water-processable n-type semiconductor comprised of a composite film, wherein the composite film is comprised of polyvinylpyrrolidone (PVP), carbon nanotubes (CNTs) and poly(ethyleneimine) (PEI).

2. The semiconductor of claim 1, wherein the CNTs are multiwalled CNTs (MWCNTs).

3. The semiconductor of claim 2, wherein the MWCNTs are graphitized.

4. The semiconductor of claim 1, further comprising a substrate.

5. The semiconductor of claim 4, wherein the substrate is selected from the group consisting of an insulating polymer film, a glass plate and a ceramic plate.

6. The semiconductor of claim 4, wherein the substrate is connected to a means for conducting electricity.

7. The semiconductor of claim 4, wherein the composite film is in contact with a surface of the substrate.

8. The semiconductor of claim 1, wherein CNTs comprise between about 30 to 70 percent by weight of the composite film.

9. The semiconductor of claim 1, wherein PVP comprises between about 30 to 70 percent by weight in ratio to CNTs.

10. The semiconductor of claim 1, wherein PEI comprises between about 0.0001 to 50 percent by weight in ratio to CNTs.

11. The semiconductor of claim 1, wherein PEI in proportion to CNT is at a ratio of between 0.001 and 1.

12. The semiconductor of claim 1, wherein the composite film further comprises a hydrophilic solution.

13. The semiconductor of claim 12, wherein the hydrophilic solution is water.

14. The semiconductor of claim 1, further comprising an electrode in contact with the composite film.

15. The semiconductor of claim 1, wherein the electrode is a source, drain or gate electrode.

16. A thermoelectric device comprising the water-processable n-type semiconductor of claim 1, a p-type semiconductor, a substrate and a means for conducting electricity.

17. A method for making the semiconductor of claim 1, comprising:
   (a) adding PVP, CNTs and PEI to a container holding water to form a mixture;
   (b) mixing the mixture;
   (c) applying the mixture to a surface.

18. The method of claim 17, wherein the mixture is mixed by sonication.

19. The method of claim 17, wherein the mixture is applied by spray coating, painting, or inkjet printing.

* * * * *